United States Patent
Bugeja

(10) Patent No.: US 6,445,319 B1
(45) Date of Patent: Sep. 3, 2002

(54) ANALOG TO DIGITAL CONVERTER CIRCUIT

(75) Inventor: Alexander R. Bugeja, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/569,118

(22) Filed: May 10, 2000

(51) Int. Cl.$^7$ .................................................. H03M 1/62
(52) U.S. Cl. ...................................... 341/138; 341/155
(58) Field of Search ................................ 341/143, 144, 341/155, 118, 120, 138

(56) References Cited

U.S. PATENT DOCUMENTS

| | | | |
|---|---|---|---|
| 4,371,868 A | 2/1983 | Van de Grift et al. | 340/347 |
| 4,415,882 A | 11/1983 | Akazawa et al. | 340/347 |
| 4,903,024 A | 2/1990 | Evans et al. | 341/110 |
| 4,943,807 A * | 7/1990 | Early et al. | 341/120 |
| 5,047,769 A * | 9/1991 | Engeler et al. | 341/118 |
| 5,257,026 A * | 10/1993 | Thompson et al. | 341/118 |
| 5,422,643 A * | 6/1995 | Chu et al. | 341/141 |
| 5,465,092 A | 11/1995 | Mayes et al. | 341/118 |
| 5,499,027 A | 3/1996 | Karanicolas et al. | 341/120 |
| 5,510,789 A | 4/1996 | Lee | 341/120 |
| 5,594,612 A | 1/1997 | Henrion | 341/120 |
| 5,668,551 A | 9/1997 | Garavan et al. | 341/120 |
| 5,771,012 A | 6/1998 | Shu et al. | 341/118 |
| 5,784,016 A | 7/1998 | Nagaraj | 341/120 |
| 5,793,319 A * | 8/1998 | Ard | 341/120 |
| 5,818,370 A * | 10/1998 | Sooch et al. | 341/120 |
| 5,861,826 A | 1/1999 | Shu et al. | 341/120 |
| 5,861,828 A | 1/1999 | Opris | 341/120 |
| 5,870,041 A | 2/1999 | Lee et al. | 341/118 |
| 6,198,416 B1 * | 3/2001 | Velazquez | 341/118 |

OTHER PUBLICATIONS

Seung–Hoon Lee and Band–Sup Song, *Digital–Domain Calibration of Multistep Analog–to–Digital Converters*, IEEE Journal of Solid–State Circuits, vol. 27, No. 12, Dec. 1992, pp. 1679–1688.

\* cited by examiner

*Primary Examiner*—Peguy JeanPierre
(74) *Attorney, Agent, or Firm*—Pedro P. Hernandez; W. James Brady III; Frederick J. Telecky, Jr.

(57) ABSTRACT

An analog-to-digital converter (ADC) (12) having a nonlinear transfer function with a unique mapping. The ADC (12) is adapted to produce a digital output signal for a plurality of analog input signals, and a transfer function modifying circuit (14) is coupled to the ADC circuit (13). The transfer function modifying circuit (14) is adapted to modify the ADC circuit (13) transfer function (34) to have a unique mapping. The ADC (12) transfer function has multiple transfer function segments with varying slopes. Further disclosed is a method for designing an ADC (12) having a nonlinear transfer function, and a method for calibrating an ADC (12).

28 Claims, 5 Drawing Sheets

ANALOG TO DIGITAL CONVERTER CIRCUIT

TECHNICAL FIELD

This invention relates generally to the design of electronic circuits, and more particularly to analog-to-digital converters.

BACKGROUND OF THE INVENTION

Analog-to-digital converters (ADCs) are widely used to process electrical signals in many electronic applications. An integrated circuit ADC typically accepts an analog voltage signal and converts the signal into a digital form as the output. ADCs for high speed and high resolution applications, for example, having a speed greater than 10 MHz and a resolution of greater than 10$b$ are not straightforward to design because of the conflicting requirements of high precision and high speed. High precision in general requires accurate high-gain closed-loop circuits with long settling times and averaging characteristics to remove noise-based factors from the circuit output and ensure settling to precise values, which conflicts with the high speed requirement. High speed circuits are best implemented as simple low-gain open-loop designs, but such designs are inaccurate and do not meet the precision requirements.

Various techniques such as calibration, trimming, and dynamic element matching, have been used for years in the prior art to correct for the imperfections of the analog circuit in the ADC. These techniques have different spheres of application. Techniques tied to the real/virtual modification of component values, such as trimming and dynamic element matching, are suitable for removing nonlinearities associated with component mismatch. For example, trimming or dynamic element matching are commonly applied to remove the mismatch between capacitor values in switched-capacitor pipelined ADC architectures. Techniques such as digital calibration are more general in nature and can be applied to remove the effects of such mismatch but also to detect other sources of nonlinearities in the system. For example, digital calibration of switched-capacitor pipelined ADCs may be used to remove the effects of both component mismatch as well as gain error in the stages, as described further by Lee & Song in the IEEE Journal of Solid-State Circuits, December 1992 in an article entitled "Digital-Domain Calibration of Multistep Analog-to-Digital Converters".

While some techniques and circuits of the prior art solve the problem for specific circuit architectures, there exists a need for a more general calibration solution applicable to ADCs in a wide variety of architectures.

SUMMARY OF THE INVENTION

The present invention provides an ADC that is robust enough to allow the use of analog circuits in the ADC with accuracy falling far short of the nominal required precision of the ADC, with the remaining accuracy made up for by the calibration circuit. The present invention achieves technical advantages as a practical circuit architecture for the design of high accuracy analog-to-digital converters using analog circuits whose intrinsic accuracy is augmented using digital calibration, using common circuit building blocks and methodologies in integrated circuit form. The ADC circuit transfer function is nonlinear, has a unique mapping, and may have multiple transfer function segments with varying slopes. The transfer function unique mapping is achieved by altering the ADC circuit transfer function, preferably by increasing the slope of the ADC transfer function.

Disclosed is an ADC having an ADC circuit adapted to produce a digital output signal for a plurality of analog input signals, where the ADC circuit has a nonlinear transfer function.

Further disclosed is an ADC including an ADC circuit adapted to produce a digital output signal for a plurality of analog input signals. The ADC circuit has a nonlinear transfer function. A transfer function modifying circuit is coupled to the ADC circuit, the transfer function modifying circuit being adapted to modify the ADC circuit transfer function to have a unique mapping.

Also disclosed is a method of designing an ADC including the step of designing an ADC circuit having a nonlinear transfer function with a unique mapping.

Further disclosed is a method of calibrating an ADC including the step of modifying an ADC circuit to have a nonlinear transfer function with different digital output signals for a plurality of analog input signals, with each digital output signal being different from every other digital output signal. The calibration method also includes the step of calibrating the modified ADC over the plurality of analog input signals.

Advantages of the invention include an ADC having analog circuits that exhibits considerably higher resolutions than existing designs. ADCs with accuracy specifications similar to existing ADCs may be designed that have simpler analog circuits which are easier to design, faster and consume less power. The ADC may be considered as one "black box" and be calibrated on an. end-to-end basis. The only requirement imposed is the unique mapping condition for the transfer function. There is no need to calibrate individual components as in the prior art, which saves IC real estate and design time. The present invention may be applied to imprecise but fast-settling circuits to create circuits which are effectively both precise and fast. The invention may be used to produce less fast/accurate ADC designs with lower power/size analog circuits.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

Figure 1:
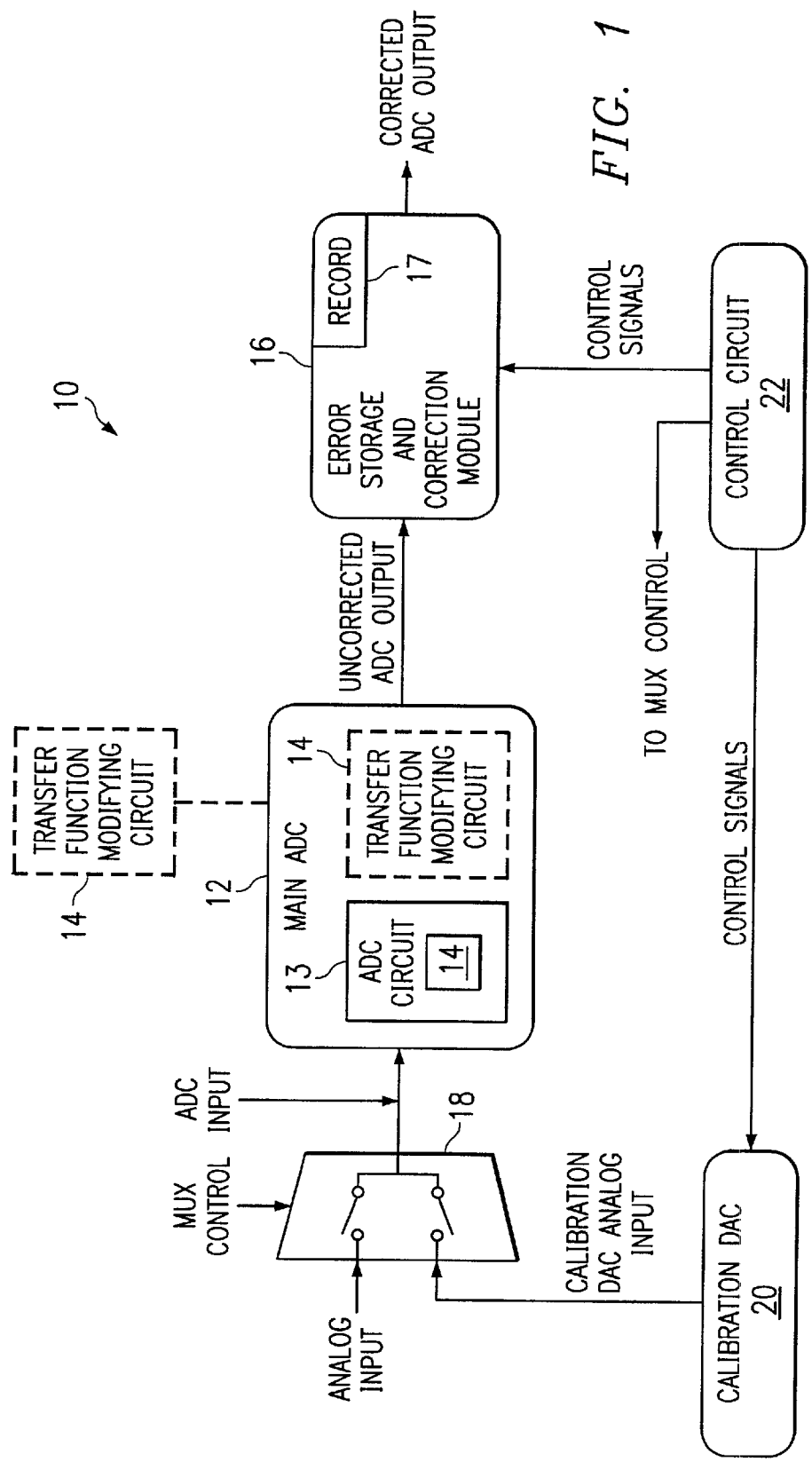
FIG. 1 illustrates the architecture of the present invention having a main ADC with a transfer function modifying circuit coupled to an error storage and correction module, a control circuit and a calibration DAC.

An exemplary embodiment of the best mode of the present invention is illustrated in FIG. 1. A main ADC 12 comprising an ADC circuit 13 and a transfer function modifying circuit 14 is adapted to generate uncorrected output signals. The main ADC 12 transfer function modifying circuit 14 is preferably integral to the ADC circuit 13 e.g., the modifying circuit 14 is implicit in the ADC circuit 13 design and does not involve additional hardware but rather has different hardware than would ordinarily be used. Alternatively, the ADC 12 transfer function modifying circuit 14 may be separate from the ADC circuit 13 yet located on the same integrated circuit, or external to the main ADC 12, as shown in phantom. The ADC 12 is coupled to and provides uncorrected outputs to an error storage and correction module 16. A multiplexer 18 is adapted to direct the input to the main ADC 12 from either the true analog input or from a calibration DAC 20, for example. A control circuit 22 controls the multiplexer 18 and sends control signals to the error storage and correction module 16, as shown. Optionally, sample-and-hold circuits coupled before or after the multiplexer may be present, not shown.

The ADC 12 can either operate in normal mode, when it converts the analog input to a digital output, or in calibration mode, when it converts the calibration DAC 20 input. During calibration mode, the calibration DAC 20 is stepped through a number of possible inputs throughout the input range of the ADC 12. The calibration DAC 20 comprises a statically high precision calibration, but because the speed of the DAC 20 does not need to be high and therefore the calibration may be performed at low speed, the design of the DAC 20 does not present a problem.

Generally, it is preferable that every one of the possible ADC 12 inputs is tested using the calibration DAC 20. For a 14$b$ ADC this is $2^{14}$ or 16,384 possible inputs. However, if some information is known about the transfer characteristic of the ADC, testing all possible inputs may not be necessary. For example, if the ADC 12 is known to be locally linear at the resolution level required for the particular design application in some region of its transfer function characteristic, extensive testing in this region can be skipped, and a linear interpolative process may be carried out to deduce the ADC characteristic. For purposes of discussion, an assumption is made herein that the calibration DAC 20 is stepped through all possible input levels.

During the calibration mode, as the calibration progresses, a record 17 is kept of the uncorrected ADC output for each calibration DAC input. The record 17 is stored in lookup table format or some other means of storage in the error storage and correction module 16, which operation is synchronized with the calibration DAC 20 operation by means of the control circuit 22. The stored record 17 provides a full record of the ADC 12 transfer function or characteristic measured during the calibration phase. The transfer function is equivalent to the one the ADC 12 will exhibit in normal operation, particularly if the analog circuits in the ADC 12 are fast-settling, which is preferable, to ensure that if the calibration is run at a low frequency clock, the ADC 12 will behave in the same manner as during the high frequency normal operation. Therefore, for a 14$b$ application, for example, the ADC 12 analog circuits must still settle to 14$b$ accuracy with respect to their static final value, but the exact value of the static final value is not important, and can be much less than 14$b$ accurate, as it will be taken care of during the calibration process. This corresponds, for example, to operational amplifiers with high bandwidths but low gain requirements.

Once the transfer function of the ADC 12 is known and stored, an analog input can be applied, and the uncorrected ADC output can now be corrected by taking the inverse transfer function if the transfer function represents a unique mapping in accordance with the present invention.

During the calibration process, the output value of the ADC 12, which is generally non-linear, is obtained for each calibration DAC 20 input. The calibration DAC 20 is itself linear, however, so that during normal operation, the correct value of the analog input may be deduced simply by looking at the ADC 12 output value and looking up in the record stored in the error storage and correction module 16 the calibration DAC 20 input which gave the same value.

The present invention provides a practical circuit architecture for the design of high accuracy ADC's, with the ADC circuit 13 being modified with the transfer function modifying circuit 14 so that the transfer function of ADC 12 has a unique mapping. The term "unique mapping" used herein describes a transfer function characteristic having an output/input relationship such that each output signal is unique, or different, than every other output signal for a plurality of input signals. The transfer function unique mapping is preferably achieved by increasing the slope of the transfer function of the ADC circuit 13.

The modified ADC 12 transfer function is measured during the calibration period to discover the nonlinearities relevant at the resolution desired for the particular application. After the ADC transfer function has been measured, the fact that it represents a unique mapping from the input to the output results in the output being capable of being mapped back to deduce the correct input when the ADC is in normal operation. The design of an imprecise but fast-settling ADC comprising analog circuits in accordance with the present invention is straightforward since these two characteristics are not conflicting.

The unique mapping property of the ADC transfer function of present invention is important, because if there is more than one analog input that gives the same digital output, it will not be possible to distinguish between them in the reverse transfer. This condition therefore is preferably designed into the ADC 12. Monotonicity in the transfer function characteristic, when combined with sufficient gain, e.g., slope of the ADC 12 transfer function, guarantees the unique mapping property, and is a convenient design goal in practice, although non-monotonic transfer function characteristics may also satisfy the unique mapping property of the present invention at a certain resolution level. Increasing the slope of the ADC 12 transfer function is beneficial for situations where a transfer function having a monotonic characteristic gives non-unique output codes because the transfer function slope rises too slowly for there to be any distinction between some two successive input positions in terms of their corresponding output values. Also, the control circuit 22 controlling the calibration process may be designed to detect any such non-unique mappings and either halt operation with an error output or modify a circuit parameter to avoid the non-unique condition.

Figure 2:
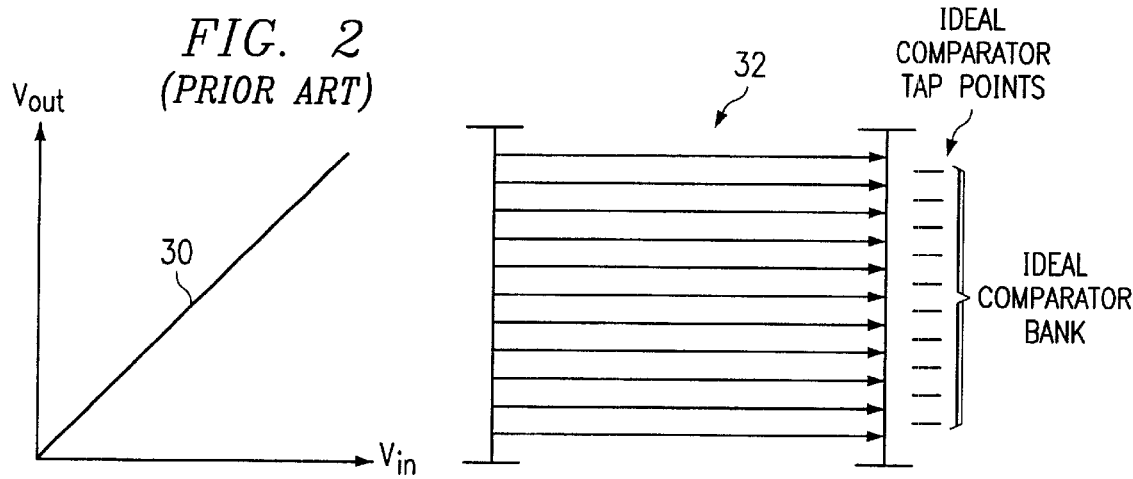
FIG. 2 shows a conceptual model of a calibration process of the prior art.
Figure 3:
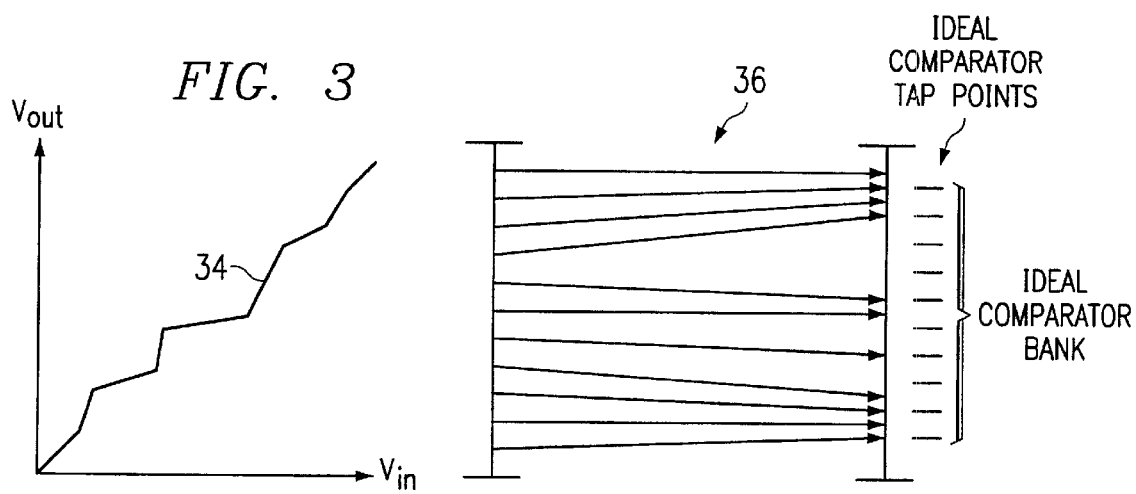
FIG. 3 shows a conceptual model of a calibration process of the present invention.

The principle of operation of the present invention is further illustrated in FIGS. 2 and 3, where conventional forms of calibration are compared conceptually to the present invention. A model of a conventional calibration is shown in FIG. 2, with an ADC represented as a circuit exhibiting an analog-to-analog transfer characteristic from the input "Vin" to an output "Vout", followed by a bank of ideal comparators which form the actual output code of the ADC. The nonlinearities of the ADC, including those of any actual comparators, are referred to the Vout/Vin characteristic of the transfer function, and after calibration this characteristic is made linear as shown at 30. A representation of the mapping described by the characteristic is shown at 32; for the case of the linear mapping of conventional calibration, this mapping is linear and one-to-one, and the comparator bank resolves the correct input value directly.

FIG. 3 shows a model or conceptual diagram of the present invention, in which the transfer characteristic 34 output from the ADC circuit 13 need not be linear, and the calibration process does not change the analog circuit of the ADC 13 from its initial nonlinear state, unlike conventional calibrations where parameters such as reference or component values are tuned depending on the calibration outcome. The nonlinear Vout/Vin transfer function or characteristic is illustrated generically at 34. Note that the ADC circuit 13 transfer function 34 may be comprised of multiple segments, each segment being substantially linear yet having different slopes. The condition that the mapping be unique in accordance with the present invention results in no two input positions Vin mapping to the same output positions Vout after all nonlinearities are mapped into the transfer characteristic. Hence, although there may be strong nonlinearity in the transfer function 34 as shown, the nonlinearity results in skipped codes, not repeated codes, with the term "code" representing a mapping of a particular value of Vin to a particular Vout value. Although not required, if the transfer function characteristic 34 is monotonic with sufficient gain at all points, as explained previously, unique mapping is ensured. Non-monotonicities in general give repeating ambiguous codes, but they may be acceptable in certain cases, for example, if they are small enough to be skipped over by the gain, or if the repeating codes are not evident because of the nature of the shape of the monotonicity. Skipped codes are only a secondary concern in that they reduce the dynamic range of the input Vin to a certain extent. This loss in dynamic range may be explicitly made up for in the circuit design; for typical designs the loss is expected to be only on the order of 5% or so, as will be shown in a simulation example later, and accommodation for skipped codes therefore may not be necessary.

Figure 4:
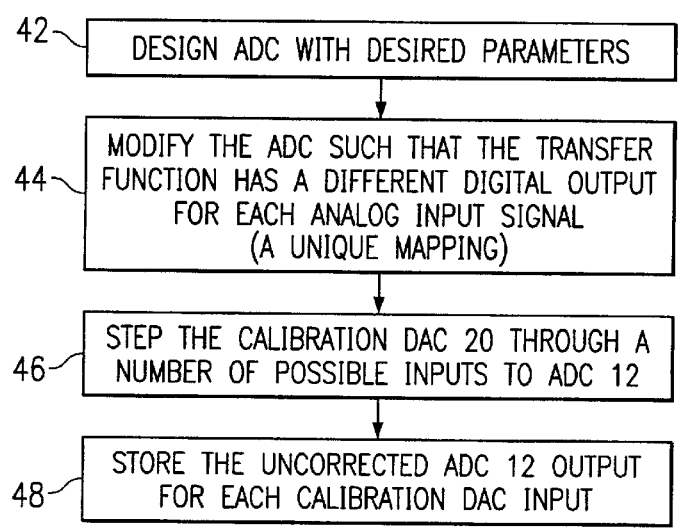
FIG. 4 illustrates a flow chart for the present invention.

FIG. 4 shows a flow chart 40 for the present invention. First, a designer designs an ADC circuit 13 having the desired parameters for a specific application (step 42). The ADC 13 is then modified so that the ADC transfer function 34 has a unique mapping, with a transfer function modifying circuit 14 (step 44). The transfer function modifying circuit 14 may be on the same chip or integrated circuit (IC) as the ADC circuit 13, or it may be external to the IC. Preferably, the transfer function modifying circuit 14 comprises internal circuitry to the ADC circuit 13 itself, which internal circuitry is modified to achieve the unique mapping transfer function. For example, internal capacitors to the ADC circuit 13 may be changed to increase the slope of the transfer function 34. The calibration DAC 20 is stepped through a plurality of possible inputs to the ADC 12 (step 46), and the uncorrected ADC 12 output is stored, for example, in a lookup table in the error storage and correction module 16 for each calibration DAC input (step 48).

Figure 5:
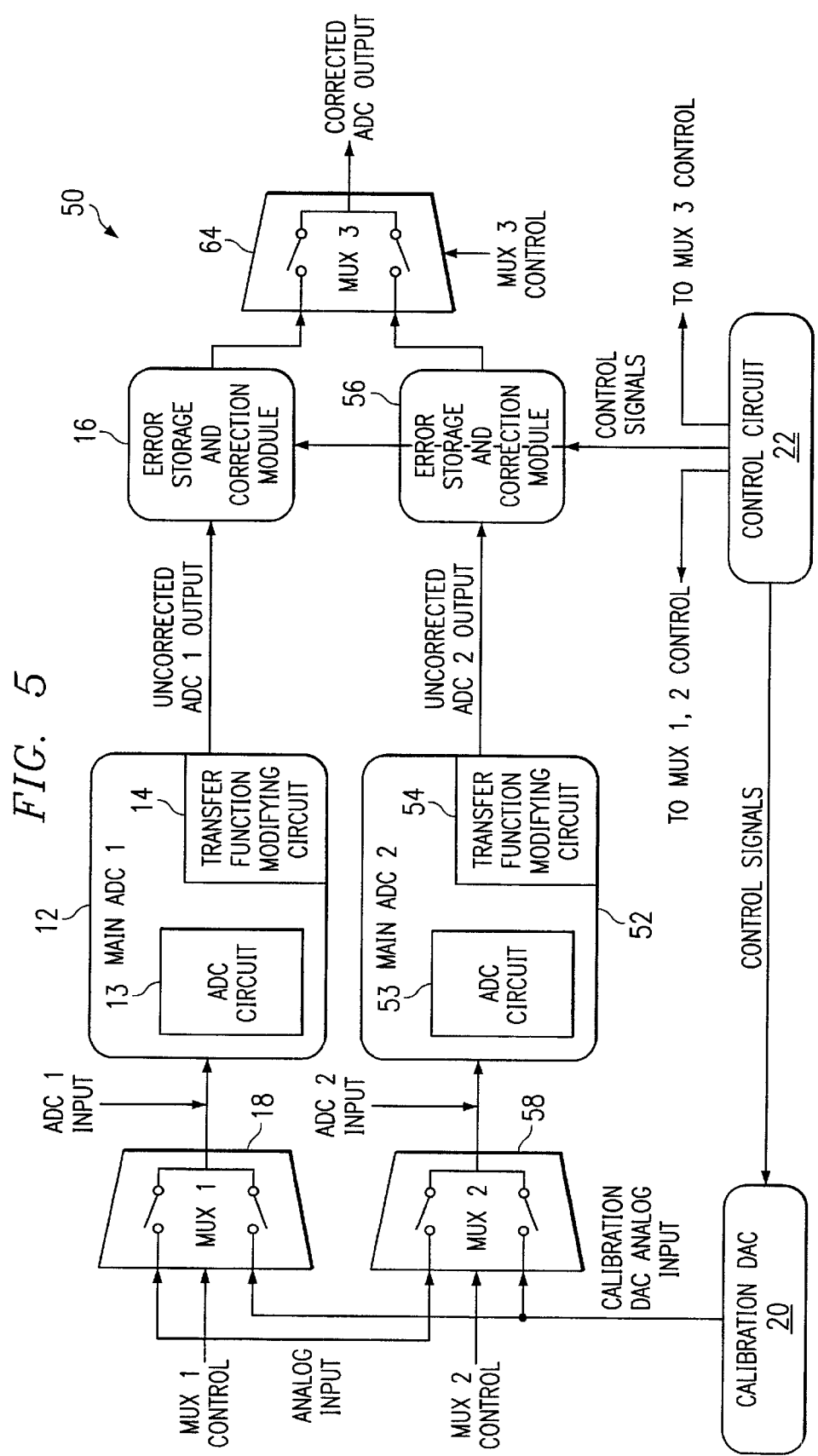
FIG. 5 shows a background implementation with two ADCs, where one ADC may be run in an operating mode while the other ADC runs in a calibration mode.

The calibration process may be run at power-up, and may also be repeated as required during normal operation to compensate for drift over time and temperature, etc., at the expense of interrupting normal ADC operation. The technique can however be readily adapted for background operation, i.e. operation without interruption of normal operation at any point, as shown in FIG. 5. In this embodiment, two ADCs 12, 52 are coupled in parallel to a multiplexer 64, and one ADC is run in calibration mode while the other ADC is run in normal mode. The ADCs 12, 52 are periodically switched in ping-pong fashion as required to maintain the calibration current. Two multiplexers 18, 58 are coupled at the ADC 12, 52 input, and multiplexer 64 is coupled at the ADC 12, 52 output to select the output of the ADC that is operating in the normal mode.

Next, some specific implementation examples at the circuit level of the proposed calibration architecture will be described. One embodiment includes a subranging architecture, for example, a two-step pipeline, or a two-stage flash ADC. In general, the linearity of a two-flash ADC is dependent on an internal resistor ladder, if we assume that comparator offsets can be cancelled out by chopping or auto-zeroing techniques. Other nonlinearities and uncancelled offsets in the comparators may be conveniently referred back to the resistor ladder. Additional nonlinearities may be additionally introduced into the resistor ladder to ensure the transfer characteristic is monotonic with sufficient slope. To achieve this, the intentional nonlinearities must be greater in value than the expected mismatch in the resistor values, so the desired transfer characteristic will be obtained despite of this mismatch. The optimum design is obtained when the intentional nonlinearities satisfy this condition but are not larger than they need to be, because then the number of skipped codes would be large and the reduction in input dynamic range would be excessive.

The present invention may also be used with multistep pipelined converters, for example, which form an output through a sequence of subtracting reference values and forming residues, with the residues generally, although not necessarily, being amplified to provide subsequent stages down the pipeline with sufficient dynamic range inputs. The pipeline component circuits are preferably modified to meet the conditions on the ADC transfer characteristic as described herein, which is generally implementable because the calibration greatly relaxes the accuracy requirements of these circuits. For example, low gain open loop amplifiers can be used for the residue amplification.

Figure 6:
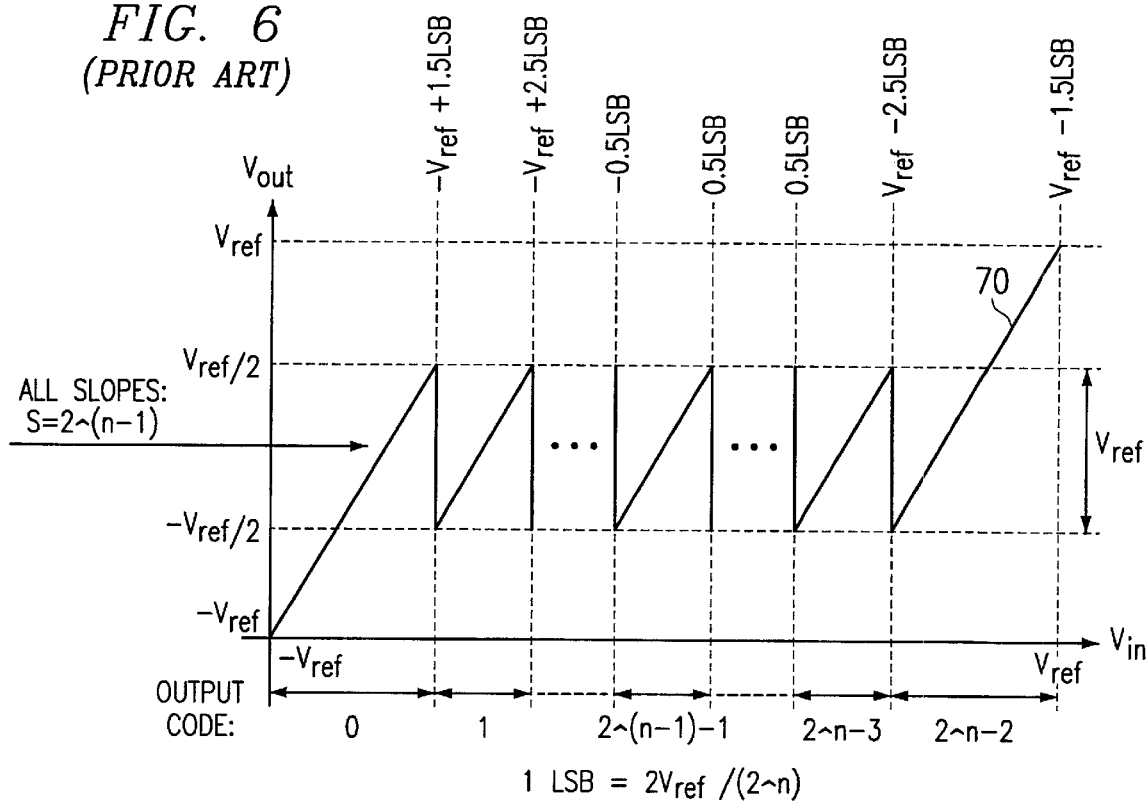
FIG. 6 shows an output of a multi-step calibration pipeline ADC implementation of the prior art.
Figure 7:
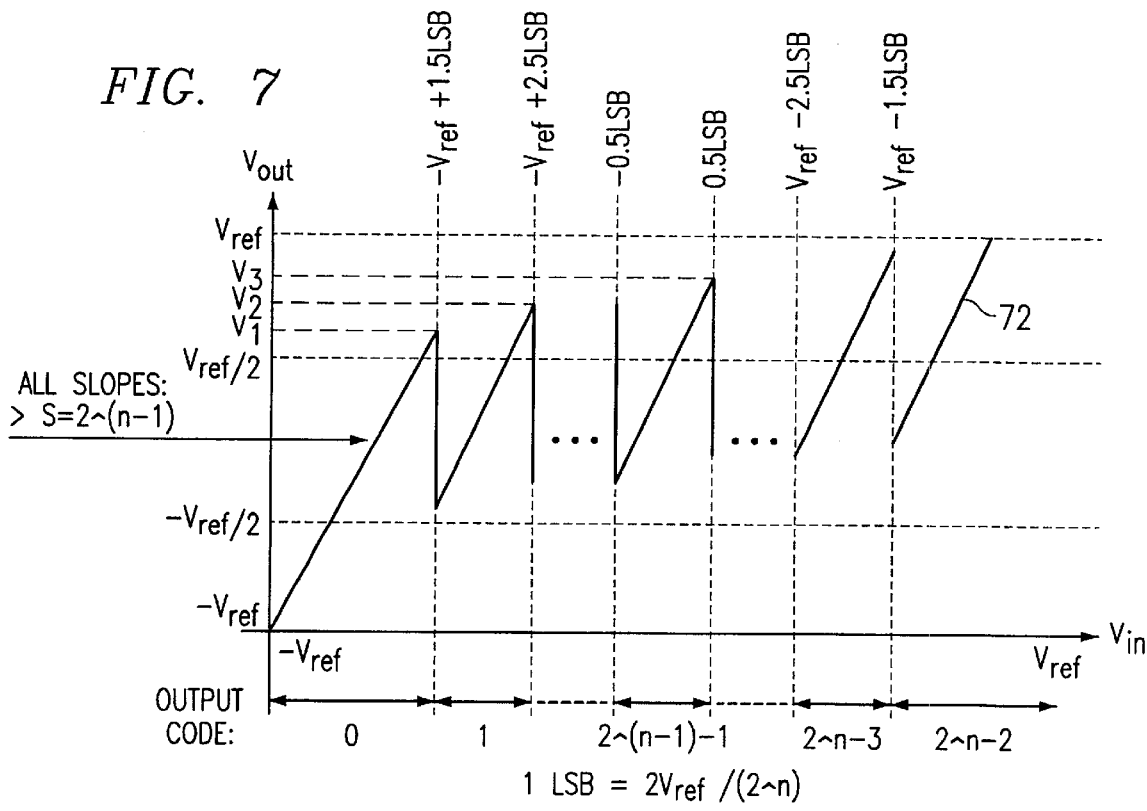
FIG. 7 shows a multi-step calibration in accordance with the present invention.
Figure 8:
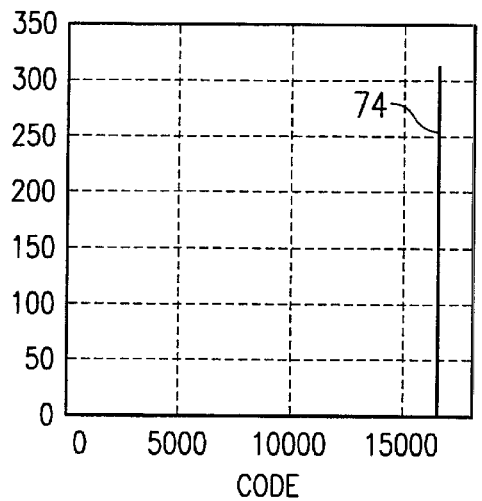
FIGS. 8–11 illustrate the results of simulating an ADC with a 5% capacitor size increase to increase the slope of the ADC transfer function.

The residue characteristics for the conventional calibration case of the prior art and of an embodiment of the present invention, for a specific example of an n-bit stage with half a bit reserved for digital correction purposes as is typically seen in modern pipelined ADCs, and with a residue gain of $2^{(n-1)}$ between stages, are shown in FIG. 6 and FIG. 7, respectively. The residue characteristic 70 of FIG. 6 shows that the output code can range from 0 to $2^{(n-2)}$, with a value Vref being subtracted from the output each time the output code is incremented. In the prior art, the Vref value and the $2^{(n-1)}$ slope gain are important parameters for obtaining ADC linearity: both will cause nonlinearities if they are not correct within the application's resolution requirements. For this reason, conventional calibration techniques aim to correct these values in some way or other if they are incorrect.

In FIG. 7, the output from a multistep ADC modified for the proposed architecture is shown at 72. No accuracy requirements on the slope or the reference subtraction step are present. The only requirements, which may be easily met without requiring any accurate design of the ADC 12 are (i) the slope of transfer function 72 should be large enough to guarantee that no two input positions map to the same output code, and (ii) the slope should be large enough to ensure that the increase of each rising slope segment more than makes up for the subtraction of the reference at the code boundaries. These requirements are drawn in exaggerated fashion in FIG. 7 for the purposes of clarity. The reference subtraction should be viewed as a "necessary evil" to keep the output of the stage within range. The reference subtraction should not be made any larger than required for this, to guard against the possibility of non-monotonicity. One way in which such a residue characteristic can be obtained is with standard switched-capacitor circuits where the op-amps are low gain but fast-settling, to take advantage of the calibration architecture. The capacitor values themselves may be modified to ensure the two conditions mentioned above are satisfied. In particular, if the input and reference capacitors are separated, the values of the input capacitors can be increased to guarantee that both conditions are met. This entails the loss of some speed of operation owing to the larger feedback factor, but the low-gain amplifier stages may typically be designed with plenty of excess bandwidth in order to compensate for this.

Figure 9:
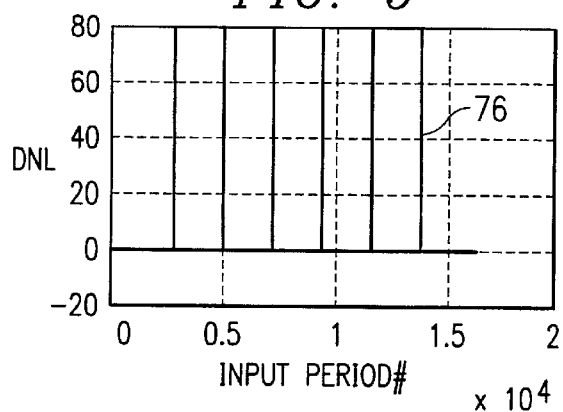
Figure 10:
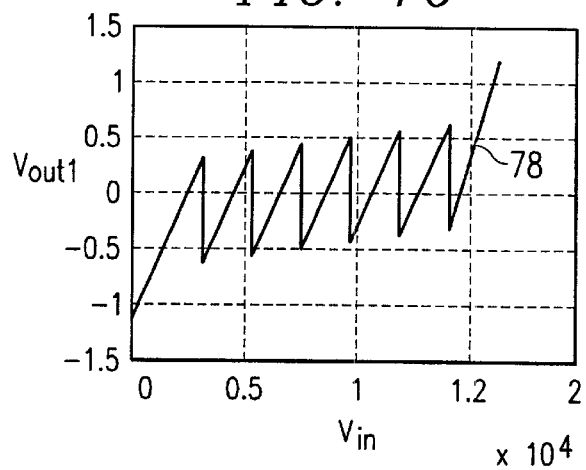
Figure 11:
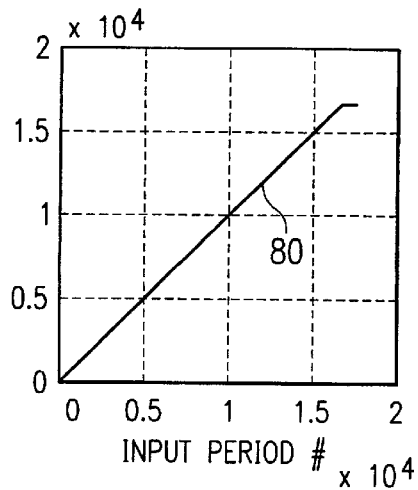

The results of simulating a pipeline circuit where an intentional 5% capacitor size increase has been applied are shown in FIGS. 8–11. The 5% increase is well in excess of expected capacitor mismatch (0.1%), so the results shown may be assumed to be general. FIG. 10 shows the simulated transfer function at 78. In this simulation, the first stage of the ADC has been designed in accordance with the present invention, while the subsequent pipeline stages are assumed to be ideal. Typically, the lower stages pose smaller design challenges so this assumption is quite accurate in practice. As shown in FIG. 9, the DNL 76 of the ADC transfer characteristic is always positive, with some larger steps being observed at the code boundary due to the intentional mismatch. Besides these-larger steps, several DNL errors of size +1 are also just visible; these show up in the code frequency (histogram) test as skipped codes. However there are no repeated codes visible in the histogram, i.e., no negative DNL steps. The skipped codes do imply a loss of dynamic range, as can be seen at 80 in FIG. 11 and also in the endpoints of the code frequency test at 74 in FIG. 8, which show approximately 300 codes accumulating at either end of the characteristic. This 5% loss of dynamic range corresponds to the 5% capacitor mismatch introduced.

Another way in which a multistep pipeline may be designed, rather than using a switched capacitor, is in the current domain, and the present invention makes this a particularly attractive choice. An open loop inaccurate yet fast current domain pipelined ADC circuit may be designed to fit the above conditions. The comparator banks in each stage may be implemented in current domain or as voltage comparators operating on voltage versions of the current obtained by mirroring the currents and feeding them to resistors, for example. The subtraction may be made directly in the current domain if the sub-DACs of each stage are current mode switched DACs, as is most convenient. The inter-stage gain may be obtained from a current mirror circuit. Although this gain is not accurate, it may be over-designed by a 5% or similar factor as described above for the switched capacitor case to guarantee correct functionality of the overall circuit.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. There are many other ADC circuits which benefit from the present invention. It is therefore intended that the appended claims encompass any such modifications or embodiments.

What is claimed is:

1. An analog-to-digital converter (ADC), comprising:
   an ADC circuit adapted to produce a digital output signal for a plurality of analog input signals, said ADC circuit having a nonlinear transfer function; and
   a transfer function modifying circuit coupled to said ADC circuit, said transfer function modifying circuit adapted to modify said ADC circuit transfer function to have a unique mapping.

2. The ADC according to claim 1 wherein said nonlinear transfer function comprises multiple transfer function segments having different transfer characteristics.

3. The ADC according to claim 1, further comprising a self-calibration circuit coupled to said ADC adapted to calibrate said ADC.

4. The ADC according to claim 3 wherein said self-calibration circuit comprises:
   an error storage and correction module coupled to said ADC;
   a control circuit coupled to said error storage and correction module; and
   a calibration digital-to-analog converter (DAC) coupled to said control circuit and said ADC.

5. The ADC according to claim 4 wherein said control circuit is adapted to detect non-unique mappings and either halt the ADC operation with an error output or modify said ADC circuit to avoid non-unique mapping, when non-unique mappings are detected.

6. An analog-to-digital converter (ADC), comprising:
   an ADC circuit adapted to produce a digital output signal for a plurality of analog input signals, said ADC circuit having a nonlinear transfer function; and
   a transfer function modifying circuit coupled to said ADC circuit, said transfer function modifying circuit adapted to modify said ADC circuit transfer function to have a unique mapping.

7. The ADC according to claim 6 wherein said ADC circuit transfer function has multiple transfer function segments with varying slopes.

8. The ADC according to claim 7 wherein said transfer function modifying circuit comprises an amplifier, wherein the slope of said ADC circuit transfer function is increased by said amplifier such that each said digital output signal is different than every other said digital output signal for said plurality of analog input signals.

9. The ADC according to claim 8 wherein said transfer function modifying circuit comprises at least one capacitor.

10. The ADC according to claim 7 wherein said ADC transfer function is monotonic.

11. The ADC according to claim 7, further comprising a self-calibration circuit coupled to said ADC adapted to calibrate said ADC.

12. The ADC according to claim 11 wherein said self-calibration circuit comprises:
   an error storage and correction module coupled to said ADC;
   a control circuit coupled to said error storage and correction module; and
   a calibration digital-to-analog converter (DAC) coupled to said control circuit and said ADC.

13. The ADC according to claim 12 wherein said control circuit is adapted detect non-unique mappings.

14. The ADC according to claim 13 wherein said control circuit is adapted to halt the ADC operation with an error output when non-unique mappings are detected.

15. The ADC according to claim 13 wherein said control circuit is adapted to modify said ADC circuit to avoid non-unique mapping upon detection thereof.

16. The ADC according to claim 6 wherein said ADC circuit comprises said transfer function modifying circuit.

17. The ADC according to claim 6 wherein said ADC circuit comprises an integrated circuit, wherein said transfer function modifying circuit is integral to said integrated circuit.

18. The ADC according to claim 17 wherein said transfer function modifying circuit is external to said integrated circuit.

19. A method of designing an analog-to-digital converter (ADC) comprising the steps of:

designing an ADC circuit having a nonlinear transfer function with a unique mapping; and coupling a transfer function modifying circuit to said ADC circuit in order to provide for said unique mapping.

20. The method according to claim 19 wherein a plurality of analog input signals input to said ADC generates a different digital output signal for each analog output signal, wherein each said digital output signal is different from each other digital output signal, wherein said ADC transfer function comprises multiple transfer function segments having varying slopes.

21. The method according to claim 20 further comprising the step of:

calibrating said ADC over said plurality of analog input signals.

22. The method according to claim 21 wherein said calibration step comprises:

stepping said ADC circuit through said plurality of input signals; and storing the ADC circuit digital output signals from each said analog input signal.

23. The method according to claim 19 wherein said transfer function modifying circuit is adapted to increase the slope of said ADC circuit transfer function.

24. A method of calibrating an analog-to-digital converter (ADC) having a transfer function modifying circuit comprising the steps of:

modifying said ADC using said transfer function modifying circuit to have a nonlinear transfer function with different digital output signals for a plurality of analog input signals, each of said digital output signal being different from every other said digital output signal; and calibrating said modified ADC over said plurality of analog input signals.

25. The method according to claim 24 wherein said calibration step comprises:

stepping the ADC through said plurality of input voltages; and storing the ADC digital output voltages from each said analog input voltage.

26. The method according to claim 24 wherein said modifying step comprises modifying said ADC with a transfer function modifying circuit external to said ADC.

27. The method according to claim 24 wherein said transfer function modifying circuit is adapted to increase the slope of said ADC transfer function, wherein said ADC transfer function comprises multiple transfer function segments with varying slopes.

28. The method according to claim 24 further comprising the step of repeating said modifying step and said calibrating step.

\* \* \* \* \*